United States Patent [19]
Racino et al.

[11] Patent Number: 5,675,469
[45] Date of Patent: Oct. 7, 1997

[54] INTEGRATED CIRCUIT WITH ELECTROSTATIC DISCHARGE (ESD) PROTECTION AND ESD PROTECTION CIRCUIT

[75] Inventors: Gregory A. Racino; Kenneth Obuszewski, both of Austin, Tex.

[73] Assignee: Motorola, Inc., Schaumburg, Ill.

[21] Appl. No.: 501,530

[22] Filed: Jul. 12, 1995

[51] Int. Cl.[6] .................................................. H02H 9/04
[52] U.S. Cl. ........................................ 361/212; 361/111
[58] Field of Search .............................. 361/212, 220, 361/91, 111

[56] References Cited

U.S. PATENT DOCUMENTS

| | | | |
|---|---|---|---|
| 4,405,933 | 9/1983 | Avery | 357/13 |
| 4,484,244 | 11/1984 | Avery | 361/56 |
| 4,630,162 | 12/1986 | Bell et al. | 361/56 |
| 4,631,567 | 12/1986 | Kokado et al. | 357/38 |
| 4,875,130 | 10/1989 | Huard | 361/56 |
| 4,939,616 | 7/1990 | Rountree | 361/56 |
| 5,010,380 | 4/1991 | Avery | 357/23.13 |
| 5,072,273 | 12/1991 | Avery | 357/38 |
| 5,291,051 | 3/1994 | Hoang | 257/360 |
| 5,345,357 | 9/1994 | Pianka | 361/56 |
| 5,359,211 | 10/1994 | Croft | 361/91 |
| 5,430,595 | 7/1995 | Wagner et al. | 361/56 |
| 5,473,169 | 12/1995 | Ker et al. | 361/91 |

*Primary Examiner*—Fritz Fleming
*Attorney, Agent, or Firm*—Paul J. Polansky

[57] ABSTRACT

An integrated circuit (20) includes an ESD protection circuit (50) to protect it from excessive electrostatic discharge voltages. The ESD protection circuit (50) includes a diode (51) in series with a silicon controlled rectifier (SCR) (60) connected between an input signal line (42) and a power supply voltage terminal. Unlike conventional protection circuits, the ESD protection circuit (50) allows the voltage on the input signal line (42) to extend well beyond positive and negative power supply potentials, and only becomes conductive to discharge voltages which are outside of this extended range.

6 Claims, 2 Drawing Sheets

INTEGRATED CIRCUIT WITH ELECTROSTATIC DISCHARGE (ESD) PROTECTION AND ESD PROTECTION CIRCUIT

FIELD OF THE INVENTION

This invention relates generally to integrated circuits, and more particularly, to circuits which protect integrated circuits from the harmful effects of electrostatic discharge.

BACKGROUND OF THE INVENTION

Integrated circuits (ICs), in particular those fabricated from metal-oxide-semiconductor (MOS) transistors, are susceptible to damage when subjected to electrostatic discharge (ESD). This discharge may occur, for example, through the skin of the hand when a human being picks up an IC, and a discharge of up to several thousand volts is possible. Such a discharge may rupture the gates of the MOS transistors connected to the IC pin, causing massive circuit failure. Another more subtle form of damage may occur in which input signal pins "leak", or have significant current flow.

A typical ESD protection circuit includes two diodes, one for protection against positive ESD discharges, and the second for protection against negative ESD discharges. To protect against a positive ESD discharge, the first diode has a positive terminal connected to the input signal line, and a negative terminal connected to the more-positive power supply voltage terminal. When an electrostatic voltage which is greater than the power supply by more than a diode drop (about 0.7 volts (V) for silicon diodes) appears on the input pin, this diode becomes forward biased and forms a conduction path to discharge the large positive voltage. To protect against a negative ESD discharge, the second diode has a negative terminal connected to the input signal line, and a positive terminal connected to the more-negative power supply voltage terminal. When an electrostatic voltage which is more than a diode drop below the voltage of the more-negative power supply voltage terminal appears on the pin, this diode becomes forward biased and forms a conduction path for the large negative voltage.

Under normal circumstances, this protection structure has been adequate. For example in present-day complementary MOS (CMOS) technology which uses 0.8 micron minimum gate length transistors, for example, the two-diode ESD protection circuit is able to protect the internal circuitry and prevent leakage for voltages in the range of between 2,000 and 4,000 volts.

In some circumstances the diode protection scheme is inadequate. For example, some input pins must accept input voltages that extend well beyond the range of the power supply voltages. More particularly, these circuits receive asymmetrical ranges of input voltages, for example, between −16 and +26 volts. For these cases the two-diode structure cannot be used because the diodes would become conductive within the allowed range of input voltages. In this circumstance, other known structures such as lateral bipolar transistors are inadequate to provide desired ESD protection as well. What is needed, then, is an ESD protection circuit which is able to protect against large positive and negative ESD discharges while accepting wide ranges of input voltages. The present invention provides such a circuit, and these and other features and advantages will be more clearly understood from the following detailed description taken in conjunction with the accompanying drawings.

DETAILED DESCRIPTION OF A PREFERRED EMBODIMENT

Figure 1:
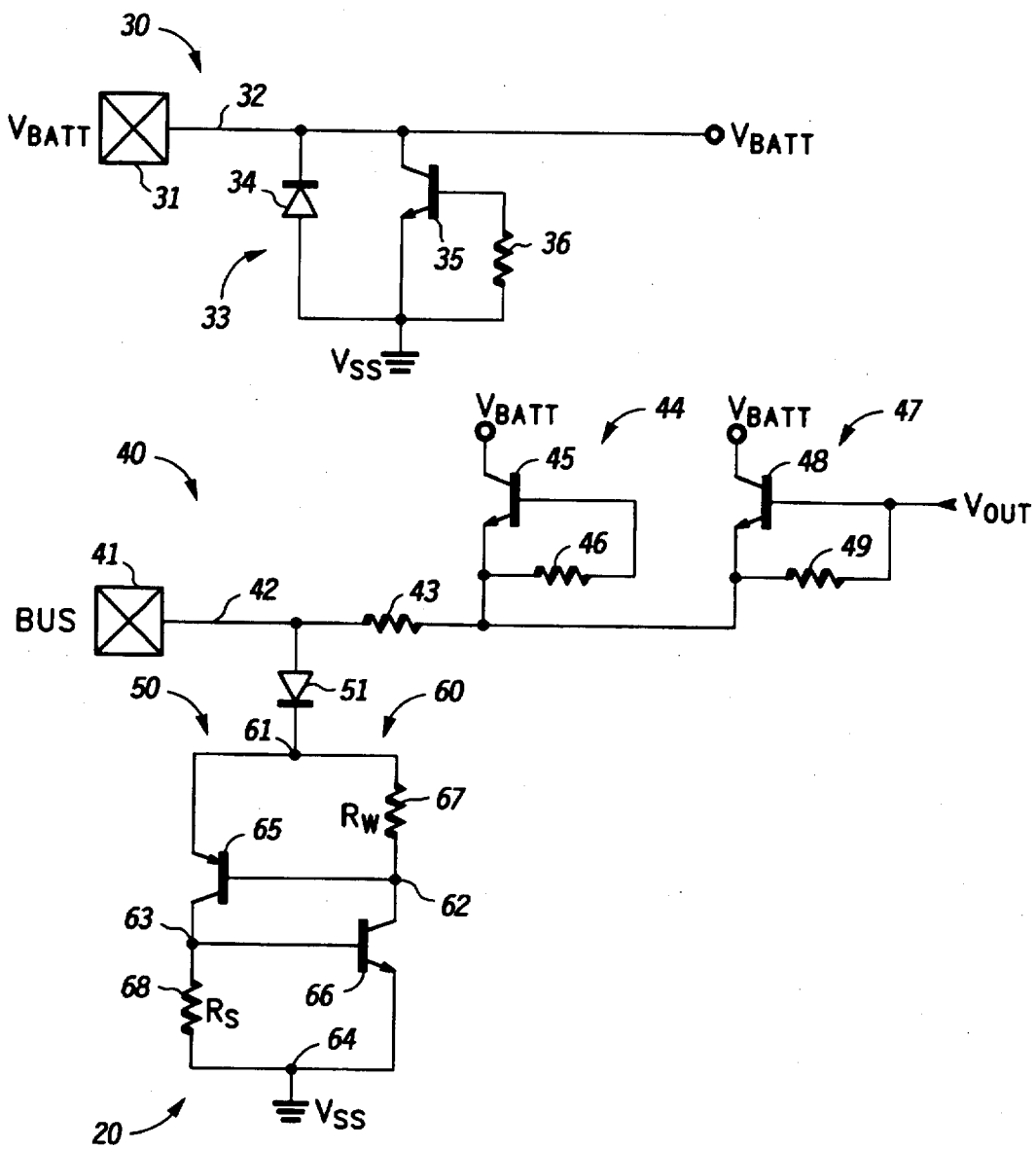
FIG. 1 illustrates in partial schematic and partial block form a portion of an integrated circuit having an electrostatic discharge (ESD) protection circuit according to the present invention.

FIG. 1 illustrates in partial schematic and partial block form a portion of an integrated circuit 20 having an electrostatic discharge (ESD) protection circuit 50 according to the present invention. Integrated circuit 20 includes circuitry 30 associated with a power supply voltage input known as the "$V_{BATT}$" terminal, and circuitry 40 associated with an input/output signal known as the "BUS" terminal. Circuitry 30 includes a bonding pad 31, a conductor 32, and an input protection circuit 33. Bonding pad 31 receives an externally-supplied power supply voltage $V_{BATT}$, which is a more-positive power supply voltage terminal having a nominal voltage of 12 volts but which may be any value in the range of −0.5 to 40 volts. Bonding pad 31 is connected to a conductor 32 which provides $V_{BATT}$ to internal circuitry. Input protection circuit 33 includes a diode 34, an NPN bipolar transistor 35, and a resistor 36. Diode 34 has a negative terminal connected to conductor 32, and a positive terminal connected to a power supply voltage terminal labelled "$V_{SS}$". $V_{SS}$ is a more-negative power supply voltage terminal having a nominal potential of 0 volts. Transistor 35 has a collector connected to conductor 32, a base, and an emitter connected to $V_{SS}$. Resistor 36 has a first terminal connected to the base of transistor 35, and a second terminal connected to $V_{SS}$, and represents the parasitic resistance created when transistor 35 is fabricated as a lateral bipolar transistor in a conventional complementary metal-oxide-semiconductor (CMOS) process.

Circuitry 40 includes a bonding pad 41, a conductor 42, a resistor 43, a secondary ESD protection circuit 44, a pin driver circuit 47, and ESD protection circuit 50. Bonding pad 41 conducts signal BUS, which is an input/output signal whose direction is determined by the operating conditions of the integrated circuit. Bonding pad 41 is connected to conductor 42, and ESD protection circuit 50 has a first terminal connected to conductor 42, and a second terminal connected to $V_{SS}$.

Conductor 42 is preferably implemented in metal in order to avoid creating a parasitic diode to the substrate which would conduct current if the voltage on bonding pad 41 was less than $V_{SS}$ by more than a diode voltage drop. However, after the connection to bonding pad 41, the conductor preferably is implemented in polysilicon, and resistor 43 represents the increased parasitic resistance caused by forming a conductor in polysilicon as opposed to metal. This extra resistance actually provides a benefit by providing additional isolation to the internal circuitry.

ESD protection circuit 50 includes a diode 51, and a silicon-controlled rectifier (SCR) 60. Diode 51 has a positive terminal connected to conductor 42, and a negative terminal. SCR 60 has an anode 61 which functions as a first current electrode connected to the negative terminal of diode 51, a cathode 64 which functions as a second current electrode connected to $V_{SS}$, an anode gate 62, and a cathode gate 63. SCR 60 is illustrated as including a PNP bipolar transistor 65 and an NPN bipolar transistor 66 forming a PNPN structure from the positive input terminal to the negative input terminal thereof. Also illustrated as part of SCR 60 are a resistor 67 formed in a well region having a resistance labelled "$R_W$," connected between anode 61 and anode gate 62, and a resistor 68 formed in a semiconductor substrate having a resistance labelled "$R_S$" connected between cathode gate 63 and cathode 64.

Resistor 43 and secondary ESD protection circuit 44 together form a secondary protection mechanism to further protect the internal circuitry associated with bonding pad 41. Secondary ESD protection circuit 44 includes an NPN bipolar transistor 45, and a resistor 46. Transistor 45 has a collector connected to $V_{BATT}$, a base, and an emitter connected to the second terminal of resistor 43 and to the base thereof through resistor 46. Resistor 46 is a ballasting resistor built from polysilicon to ensure a balanced current flow in all sections of the large vertical bipolar transistor 45. The inclusion of resistor 46 is a common technique to increase the collector-to-emitter voltage in breakdown ($V_{CEO}$). Pin driver circuit 47 includes an NPN bipolar transistor 48, and a resistor 49. Transistor 48 has a collector connected to $V_{BATT}$, a base for receiving a signal labelled "$V_{OUT}$", and an emitter connected to the second terminal of resistor 43 and to the base thereof through resistor 49. Like resistor 46, resistor 49 is a polysilicon ballasting resistor which ensures a balanced current flow in all sections of the large vertical bipolar transistor 48 and increases its $V_{CEO}$.

Circuitry 40 must be capable of receiving input voltages in the range of from −16 volts to +26 volts without ESD protection circuit 50 becoming conductive. It is this input range that makes conventional protection circuitry inadequate for normal device operation. Known protection circuitry is based on connecting various PN-junction devices, such as diodes, zener diodes, bipolar transistors, and the like, to an input signal line. However, these conventional devices become conductive when the input signal is outside the range of power supply voltages by more than their breakdown or conducting voltages. A voltage in the range of −16 volts to +26 volts would place such devices into breakdown or their conducting state when $V_{BATT}$ and $V_{SS}$ are at their nominal values of 0 and +12, respectively.

However, ESD protection circuit 50 is capable of operating over an expanded range of voltages, such as −16 to +26 volts. However, these voltages may be altered to fit different operating conditions, as will be described below with reference to FIG. 2.

To understand the protection provided by ESD protection circuit 50, it is helpful to consider four conditions. The first two conditions assume that the $V_{SS}$ terminal (not shown in FIG. 1) is in fact grounded (connected to a zero-volt power supply). When a positive ESD voltage transient is delivered to bonding pad 41, diode 51 is conducting but will be blocked from conducting through SCR 60 until the trigger voltage is reached. SCR 60 is in the "natural" triggering mode, in which SCR 60 becomes conductive from anode 61 to cathode 64 when a parasitic diode existing between anode gate 62 and cathode gate 63 reaches breakdown voltage. This voltage may be controlled through conventional layout and sizing and preferably occurs at about +30 volts. When a negative ESD voltage transient is delivered to bonding pad 41, the conduction path is formed through resistor 68, through the forward-biased base-collector junction of transistor 66 (which is physically the same junction as the collector-base junction of transistor 65), through resistor 67, and through diode 51 when diode 51 goes into avalanche breakdown. The voltage at which this conduction begins to take place is preferably about −20 volts.

The second two conditions assume that the $V_{BATT}$ terminal is grounded but the VSS terminal is not. When a positive ESD voltage transient is delivered to bonding pad 41, the conduction path is through diode 51 and SCR 60 as described above but also through the internal $V_{SS}$ conductor through diode 34 to $V_{BATT}$. When a negative ESD voltage transient is delivered to bonding pad 41, the conduction path is formed through resistor 68, the forward-biased base-collector junction of transistor 66 (which is physically the same junction as the collector-base junction of transistor 65), resistor 67, and diode 51 as before and additionally through the collector-base junction of transistor 35 after this junction reaches breakdown.

In addition, secondary ESD protection circuit 44 provides protection specific to the circuit being protected, in this case pin driver circuit 47. Resistor 43 isolates (limits current) to secondary ESD protection circuit 44. Transistor 45 is constructed similarly to transistor 48, but is laid out to reduce the on resistance of a parasitic device that is used in breakdown to dump the ESD energy to the substrate. Secondary ESD protection circuit 44 only becomes involved in ESD protection when the magnitude of the ESD pulse is high enough to allow a sufficient voltage to build up across the on-resistance of ESD protection circuit 50.

Figure 2:
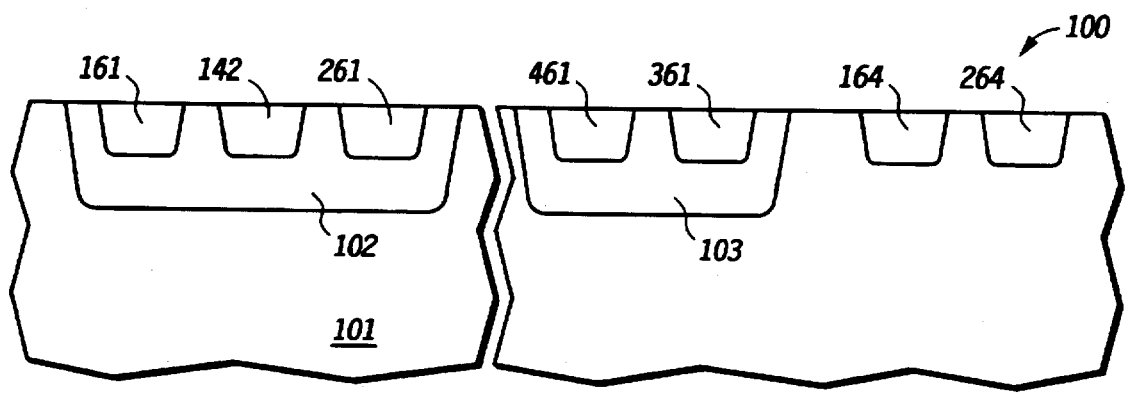
FIG. 2 illustrates, in cross section, a portion of an integrated circuit incorporating the ESD protection circuit of FIG. 1.

There are many ways apparent to those of ordinary skill in the art to implement ESD protection circuit 50 in conventional integrated circuit processes. However, certain details of the process used to implement ESD protection circuit 50 are shown in FIG. 2, which illustrates, in cross section, a portion 100 of an integrated circuit incorporating the ESD protection circuit 50 of FIG. 1. Note that FIG. 2 omits some details of portion 100 including all features above the primary surface of the substrate which in any case will be apparent to those skilled in the art. Reference numbers used in FIG. 2 correspond to circuit terminals of FIG. 1.

Considering FIGS. 1 and 2 together, portion 100 includes a P-type substrate 101, a first N-type well region 102 diffused into substrate 101, and a second N-type well region 103. Diffused into well region 102 are a heavily-doped P-type (P+) region 142 which is electrically connected to the metal layer forming conductor 42, and two heavily-doped N-type (N+) regions 161 and 261, which are connected together by a conductor not shown. Region 142 forms the first terminal of diode 51. Regions 161 and 261 form the second terminal of diode 51. Well region 103 includes a P+ region 361 and an N+ region 461. Region 361 forms the emitter of transistor 65, and its junction with well region 103 forms the emitter-base junction of transistor 65. Region 461, on the other hand, forms the first terminal of resistor 67, which ohmically connects to the base formed by well region 103. The collector of transistor 65 is formed in substrate 101, and the junction between well region 103 and substrate 101 forms the base-collector junction of transistor 65. Well region 103 also forms the collector of transistor 66. The base of transistor 66 is formed by substrate 101, and the emitter of transistor 66 is formed by N+ region 164. P+ region 264 ohmically connects cathode 64 to substrate 101 which corresponds to the base of transistor 66 and to the collector of transistor 65.

The size, relative placement, and doping concentration of each of the devices within substrate 101 determine the electrical characteristics of diode 51 and SCR 60, and these considerations are well-known to those of ordinary skill in the art. Note, however, the distances between the right edge of P+ region 361 and the right edge of well region 103 and between the right edge of well region 103 and the left edge of N+ region 164, are especially important to establishing the electrical characteristics of SCR 60.

Figure 3:
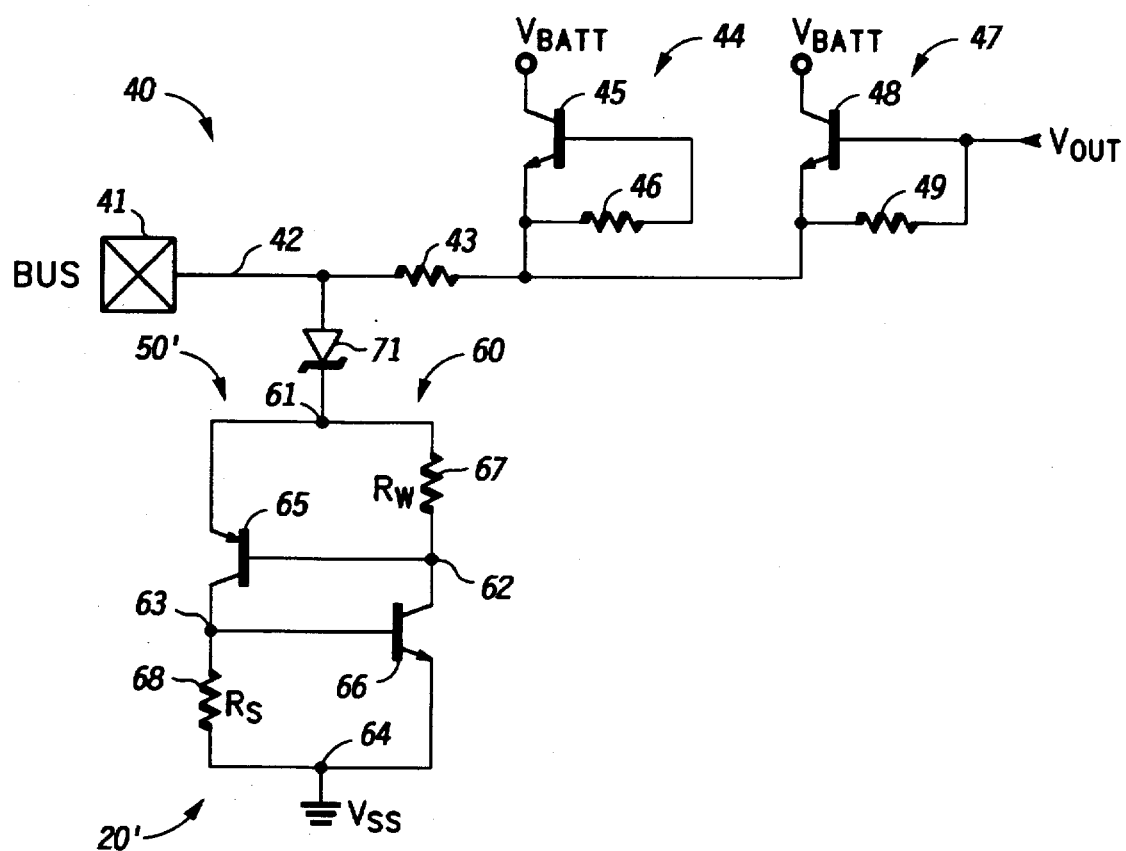
FIG. 3 illustrates in partial schematic and partial block form a second portion of an integrated circuit having an ESD protection circuit according to a second embodiment of the present invention.

While the invention has been described in the context of a preferred embodiment, it will be apparent to those skilled in the art that the present invention may be modified in numerous ways and may assume many embodiments other than that specifically set out and described above. For example, in other embodiments, diode 51, which exhibits avalanche breakdown characteristics when reverse biased, may be replaced by a zener diode. This embodiment is illustrated in FIG. 3, in which elements in common with FIG. 1 are assigned the same reference numbers. The only difference between FIG. 3 and FIG. 1 is that diode 51 has been replaced by a zener diode 71 in FIG. 3. Also, the polarities of the devices may be reversed to achieve an analogous circuit connected between conductor 42 and the more-positive power supply voltage terminal. Accordingly, it is intended by the appended claims to cover all modifications of the invention which fall within the true spirit and scope of the invention.

We claim:

1. An integrated circuit with electrostatic discharge protection comprising:

a bonding pad for serving as an interconnection point to the integrated circuit;

the integrated circuit adapted to be coupled to an external input/output signal via said bonding pad, said external input/output signal capable of assuming a predetermined voltage relative to a first power supply voltage whose absolute value is greater than an absolute value of a voltage difference between said first power supply voltage and a second power supply voltage;

a conductor coupled to said bonding pad and to a pin driver circuit; and an electrostatic discharge protection circuit coupled to said conductor;

the electrostatic discharge protection circuit comprising:

a first circuit element having a first terminal of a first conductivity type coupled to said conductor, and a second terminal of a second conductivity type; and a silicon controlled rectifier having a first current electrode of said first conductivity type coupled to said second terminal of said first circuit element, and a second current electrode of said second conductivity type coupled to a first power supply voltage terminal which provides said first power supply voltage, wherein the electrostatic discharge protection circuit only becomes conductive when a voltage on said bonding pad relative to said first power supply voltage terminal exceeds said predetermined voltage.

2. The integrated circuit of claim 1 wherein said predetermined voltage is about −16 volts and said voltage difference is about +12 volts.

3. The integrated circuit of claim 1 wherein said predetermined voltage is about +26 volts and said voltage difference is about +12 volts.

4. The integrated circuit of claim 1 wherein said silicon controlled rectifier comprises:

a first transistor having an emitter forming said first current electrode of said silicon controlled rectifier, a base, and a collector;

a first resistor having a first terminal coupled to said emitter of said first transistor, and a second terminal coupled to said base of said first transistor;

a second transistor having a collector coupled to said base of said first transistor, a base coupled to said collector of said first transistor, and an emitter forming said second current electrode of said silicon controlled rectifier and coupled to said first power supply voltage terminal; and a second resistor having a first terminal coupled to said collector of said first transistor, and a second terminal coupled to said power supply voltage terminal.

5. An integrated circuit with electrostatic discharge protection comprising:

a bonding pad for serving as an interconnection point to the integrated circuit for conducting an input/output signal;

a conductor coupled to said bonding pad and to a pin driver circuit;

a first circuit element having a first terminal of a first conductivity type coupled to said conductor, and a second terminal of a second conductivity type; and a silicon controlled rectifier having a first current electrode of said first conductivity type coupled to said second terminal of said first circuit element, and a second current electrode of said second conductivity type coupled to a power supply voltage terminal, said silicon controlled rectifier characterized as having a natural trigger, said silicon controlled rectifier comprising:

a first transistor having an emitter forming said first current electrode of said silicon controlled rectifier, a base, and a collector;

a first resistor having a first terminal coupled to said emitter of said first transistor, and a second terminal coupled to said base of said first transistor;

a second transistor having a collector coupled to said base of said first transistor, a base coupled to said collector of said first transistor, and an emitter forming said second current electrode of said silicon controlled rectifier and coupled to said power supply voltage terminal; and a second resistor having a first terminal coupled to said collector of said first transistor, and a second terminal coupled to said power supply voltage terminal.

6. The integrated circuit of claim 5 wherein said first conductivity type is characterized as being P-type, and wherein said second conductivity type is characterized as being N-type.

* * * * *